(12) United States Patent
Chang et al.

(10) Patent No.: US 8,276,803 B1
(45) Date of Patent: Oct. 2, 2012

(54) FIXING FRAME AND ASSEMBLED FIXING DEVICE FOR PRINTING SOLDER PASTE ON PRINTED CIRCUIT BOARD

(75) Inventors: Shao-Chun Chang, Longtan Township (TW); Ching-Feng Hsieh, Taipei (TW)

(73) Assignees: Askey Technology (Jiangsu) Ltd. (CN); Askey Computer Corp. (TW)

( * ) Notice: Subject to any disclaimer, the term of this patent is extended or adjusted under 35 U.S.C. 154(b) by 0 days.

(21) Appl. No.: 13/294,320

(22) Filed: Nov. 11, 2011

(30) Foreign Application Priority Data

Sep. 16, 2011 (TW) .............................. 100133341 A

(51) Int. Cl.
*B23K 37/00* (2006.01)
(52) U.S. Cl. ........................................ 228/39; 118/504
(58) Field of Classification Search ........................ None
See application file for complete search history.

(56) References Cited

U.S. PATENT DOCUMENTS

| | | | | |
|---|---|---|---|---|
| 3,391,635 A * | 7/1968 | Matheus | ..................... | 101/127.1 |
| 3,541,957 A * | 11/1970 | Bubley | ....................... | 101/127.1 |
| 3,635,730 A * | 1/1972 | Sweitzer | ....................... | 427/547 |
| 3,862,154 A * | 1/1975 | Lorenz et al. | ................. | 546/167 |
| 3,991,677 A * | 11/1976 | Barnes | ....................... | 101/127.1 |
| 4,060,030 A * | 11/1977 | Noschese | ................... | 101/127.1 |
| 4,442,772 A * | 4/1984 | Bubley | ....................... | 101/127.1 |
| 4,696,228 A * | 9/1987 | David et al. | .................... | 101/123 |
| 5,018,442 A * | 5/1991 | Hamu | ....................... | 101/127.1 |
| 5,096,524 A * | 3/1992 | Ohtani et al. | ................. | 156/160 |
| 5,113,611 A * | 5/1992 | Rosson | ........................ | 38/102.7 |
| 5,235,908 A * | 8/1993 | Froelicher et al. | ........ | 101/127.1 |
| 5,255,600 A * | 10/1993 | Hamu | ........................ | 101/127.1 |
| 5,309,831 A * | 5/1994 | Fuqua et al. | .................. | 101/126 |
| 5,327,828 A * | 7/1994 | Barocas et al. | ............. | 101/127.1 |
| 5,562,030 A * | 10/1996 | Karlyn et al. | .............. | 101/127.1 |
| 5,598,776 A * | 2/1997 | Casl | ........................... | 101/127.1 |
| 5,913,263 A * | 6/1999 | Hruska | ........................ | 101/114 |
| 5,937,753 A * | 8/1999 | McKeever | ................ | 101/127.1 |
| 5,941,171 A * | 8/1999 | Fromm | ....................... | 101/127.1 |
| 5,979,312 A * | 11/1999 | Williams | ...................... | 101/127 |
| 5,983,790 A * | 11/1999 | Switzer et al. | ............. | 101/127.1 |
| 6,038,969 A * | 3/2000 | Podlipec et al. | ........... | 101/127.1 |
| 7,284,481 B2 * | 10/2007 | Kasuya | ....................... | 101/127.1 |

(Continued)

OTHER PUBLICATIONS

Derwent Acc No. 2009-J10400 corresponds to CN-201227732Y (published 2009).*

(Continued)

*Primary Examiner* — Kiley Stoner
(74) *Attorney, Agent, or Firm* — Schmeiser, Olsen & Watts, LLP

(57) ABSTRACT

A fixing frame and an assembled fixing device printing solder paste on a printed circuit board improve an assembly process, cut production costs, and save storage space. The fixing frame has a plurality of fixing portions and a motor unit. The fixing portions are connected to each other to define a hollowed-out planar region. The motor unit generates a plurality of pulling forces by means of mechanical transmission. The assembled fixing device includes a fixing frame and a stencil. The stencil has a solder paste printing region and a plurality of fixing regions. The edge of the solder paste printing region extends outward to define the fixing regions. The fixing regions are movably fixed to the fixing portions and bear the pulling forces. The solder paste printing region lies within the hollowed-out planar region. The directions of the pulling forces are coplanar with the solder paste printing region.

12 Claims, 11 Drawing Sheets

U.S. PATENT DOCUMENTS

| | | | |
|---|---|---|---|
| 7,306,022 B2 * | 12/2007 | Hughes et al. | 156/494 |
| 7,574,788 B1 * | 8/2009 | Chamlee et al. | 29/91.1 |
| 8,091,475 B2 * | 1/2012 | Zepic et al. | 101/127.1 |
| 2002/0148370 A1 * | 10/2002 | Erdmann | 101/127.1 |
| 2004/0025722 A1 * | 2/2004 | Goss | 101/129 |
| 2004/0089169 A1 * | 5/2004 | Flatt | 101/127.1 |
| 2005/0066827 A1 * | 3/2005 | Williams | 101/127.1 |
| 2006/0090657 A1 * | 5/2006 | Bourrieres et al. | 101/127.1 |
| 2008/0184902 A1 * | 8/2008 | Vasilantone | 101/415.1 |
| 2009/0211471 A1 * | 8/2009 | Bourrieres et al. | 101/126 |
| 2011/0155003 A1 * | 6/2011 | Niswonger | 101/127.1 |

OTHER PUBLICATIONS

Derwent Acc No. 1993-165874 corresponds to SU-165874A (published 1993).*

* cited by examiner

US 8,276,803 B1

FIXING FRAME AND ASSEMBLED FIXING DEVICE FOR PRINTING SOLDER PASTE ON PRINTED CIRCUIT BOARD

CROSS-REFERENCE TO RELATED APPLICATION

This non-provisional application claims priority under 35 U.S.C. §119(a) on Patent Application No(s).100133341 filed in Taiwan, R.O.C. on Sep. 16, 2011, the entire contents of which are hereby incorporated by reference.

FIELD OF TECHNOLOGY

The present invention is related to a fixing frame and an assembled fixing device thereof, particularly to a fixing frame and an assembled fixing device for printing solder paste on a printed circuit board.

BACKGROUND

FIGS. 1 and 2 are a disassembled diagram and an assembled diagram, respectively, of a conventional assembled solder paste printing structure for printing solder paste on a printed circuit board. As illustrated in the figures, printing solder paste on the printed circuit board requires, generally, a conventional assembled solder paste printing structure 9 comprising a fixing frame 91, a hollowed-out rectangular stretching net 92 and a steel plate 93. The steel plate 93 is rectangular and has a rectangular solder paste printing region 931 and a fixing region 932. The solder paste printing region 931 is surrounded, on its four sides, by the fixing region 932, and provided with a plurality of vias 9311 for providing solder paste. The fixing region 932 is used to be stuck to inner edges of four sides of the stretching net 92, in such a way that outer edges of the four sides of the stretching net 92 may be applied with equal pulling forces to tension outwardly to flatten the steel plate 93, and then clampingly fixed in clamping slots 911 on the four sides of the fixing frame 91. To put the conventional assembled solder paste printing structure 9 in operation, a printed circuit board (not shown) is firstly fixed on a platform (not shown) of a machine (not shown) horizontally, followed by fixing the fixing frame 91 of the conventional assembled solder paste printing structure 9 on the machine, and lying the steel plate 93 of the conventional assembled solder paste printing structure 9 on the printed circuit board aligningly. Subsequently, solder paste is scraped across the solder paste printing region 931 of the steel plate 93, in such a way that the solder paste is provided within the vias 9311 of the steel plate 93 and adhered on the printed circuit board. Finally, the conventional assembled solder paste printing structure 9 is removed. The printed circuit board is then spread thereon with a plurality of spot-like of solder paste, to be further processed.

For the conventional assembled solder paste printing structure, a whole structure, instead of a disassembled single fixing frame, is required to correspond to each of a variety of printed circuit boards individually, resulting in an increase in production costs and required storage space. In addition, the replacement or reproduction of the whole conventional assembled solder paste printing structure, instead of one single disassembled expired or damaged element of the structure, is required when expiration or damage occurs, leading to wasting cost and consuming time. Moreover, the manufacturing process of fixing the steel plate of the conventional assembled solder paste printing structure in the fixing frame is complicated, because the steel plate should be stuck to the stretching net and then flattened.

Therefore, it is imperative to provide a fixing frame and an assembled fixing device for printing solder paste on a printed circuit board so as to improve an assembly process, cut production costs, and save storage space.

SUMMARY

In view of the above drawbacks of the prior art, the inventor of the present invention conducted extensive researches and experiments according to the inventor's years of experience in the related industry, and finally developed a fixing frame and an assembled fixing device for printing solder paste on a printed circuit board, so as to improve an assembly process, cut production costs, and save storage space.

For achieving the above objectives, a first mode of the present invention is a fixing frame for printing solder paste on a printed circuit board, comprising a plurality of fixing portions and a motor unit. The fixing portions are movably combined with each other to define a hollowed-out planar region, and the motor unit, provided on the fixing portion, is used for providing a plurality of pulling forces coplanar with the hollowed-out planar region by means of mechanical transmission.

A second mode of the present invention is an assembled fixing device for printing solder paste on a printed circuit board, comprising a fixing frame having a plurality of fixing portions and at least one motor unit, the fixing portions being movably combined with each other to define a hollowed-out planar region, the motor unit, provided on the fixing portions, being used for providing a plurality of pulling forces by means of mechanical transmission; and a stencil having a solder paste printing region and a plurality of fixing regions, the fixing regions being defined by outward extensions of edges of the solder paste printing region, the solder paste printing region being provided with first vias passing through the stencil and located in the hollowed-out planar region, the fixing regions being movably fixed to the fixing portion together and allowed to bear the pulling forces, the pulling forces being coplanar with the solder paste printing region so as to flatten the solder paste printing region of the stencil.

Thereby, the objectives of easy to assemble, cutting cost and reducing storage space are achieved by a fixing frame and an assembled fixing device for printing solder paste on a printed circuit board of the present invention

DETAILED DESCRIPTION

A detailed description will be made to the present invention by means of following embodiments in cooperation with accompanied drawings for fully understanding the objectives, features and effects of the present invention.

Figure 1:
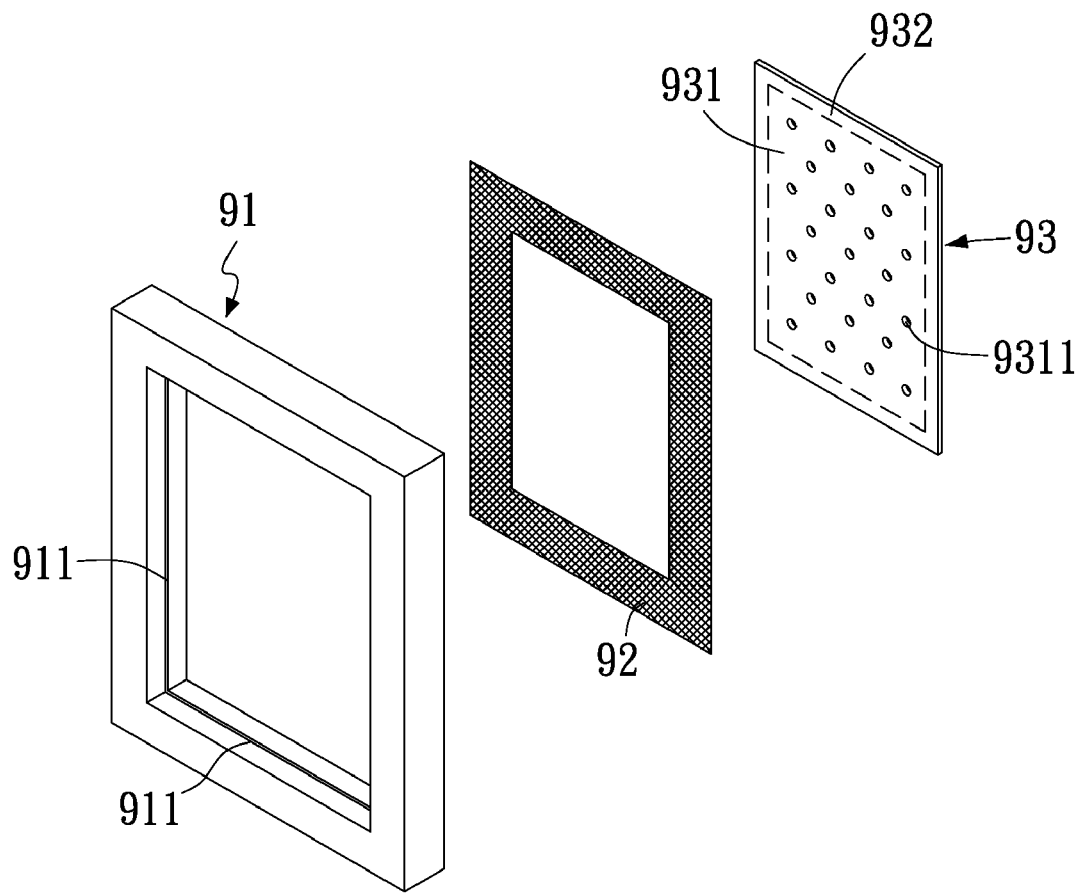
FIG. 1 (PRIOR ART) is a disassembled diagram of a conventional assembled solder paste printing structure for printing solder paste on a printed circuit board.
Figure 2:
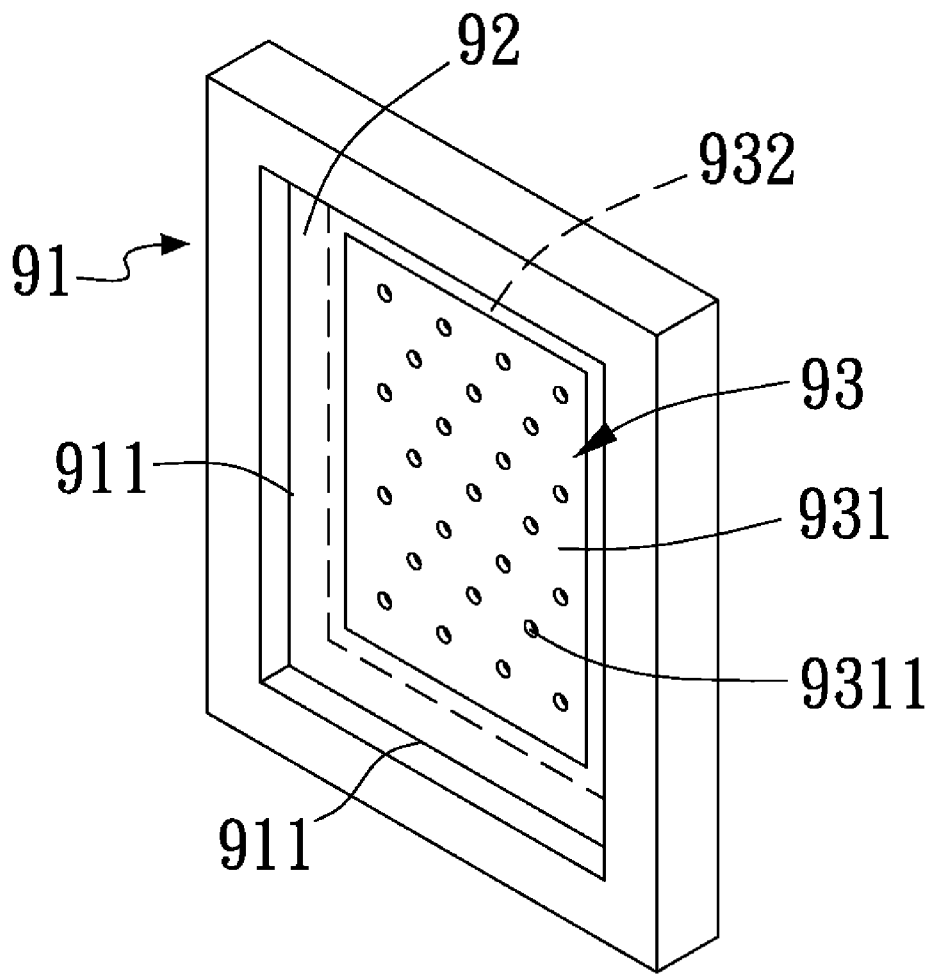
FIG. 2 (PRIOR ART) is an assembled diagram of the conventional assembled solder paste printing structure for printing solder paste on a printed circuit board.
Figure 3:
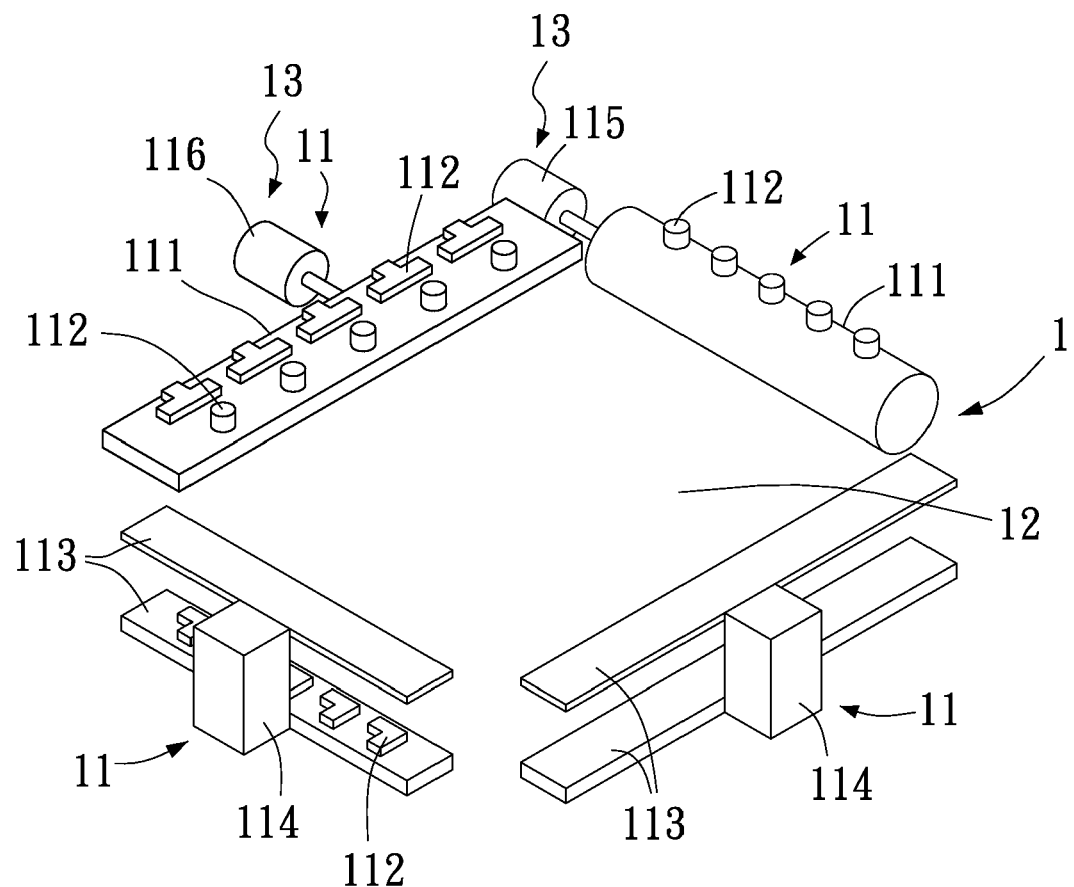
FIG. 3 is a perspective diagram of a fixing frame according to one embodiment of the present invention.

FIG. 3 is a perspective diagram of a fixing frame according to one embodiment of the present invention. As illustrated in this figure, a first mode of the present invention is directed to a fixing frame 1 for printing solder paste on a printed circuit board, having a plurality of fixing portions 11 and at least one motor unit 13. In this embodiment, there are shown four fixing portions 11 and two motor units 13. These fixing portions 11 are movably combined with each other to define a hollowed-out planar region 12. In this embodiment, the four fixing portions 11 are shown to be combined with each other to define a rectangle (These fixing portions 11 are assembled to each other by providing them on a hollowed-out frame body (not shown) together.), and the hollowed-out planar region 12 is also surrounded as a rectangle. The motor units 13, provided on the fixing portions 11, are used for providing a plurality of pulling forces, which are equal in magnitude and coplanar with the hollowed-out planar region 12, by means of mechanical transmission. The fixing frame 1 and a stencil (not shown) exist independently after they are disassembled, and one single fixing frame 1 is assembled to a variety of stencils due to the manner of motion of the fixing portions 11, in such a way that the objectives of improving an assembly process, cutting production costs and saving storage space are achieved. Moreover, the objective of ease of operation is achieved by means of mechanical transmission for the motor units 13.

The above-mentioned motion is either movable snapping or movable clamping.

The above fixing portion 11 is used for movably snapping or movably clamping a strip-like region, the strip-like region facilitating the design and manufacturing of movably snapping or movably clamping mechanism, and also the uniform distribution of pulling forces over the strip-like region during design.

When the above-mentioned fixing portion 11 is used for movably snapping, the fixing portion 11 is provided with a base 111 and a plurality of snapping posts 112, the snapping posts 112 being provided on the surface of the base 111. The base 111 is driven by the motor unit 13 manually or mechanically, so as to move the snapping posts 112 outwardly, while provide the pulling forces to the stencil. When the fixing portion 11 is used for movably clamping, the fixing portion 11 is provided with two clamping plates 113, and a driving means 114 provided between the two clamping plates 113 so as to drive the two clamping plates 113 to approach each other for clampingly fixing the stencil. The driving means 114 is formed as C-clip, for instance, to be driven manually or mechanically.

The above-mentioned base 111 is a roller for driving the snapping posts 112 to move outwardly, while applying the pulling forces to the stencil by the rotation of the roller. The magnitude of pulling forces is adjusted by turning the roller, i.e., the more the roller turns, the greater the pulling force the roller provides. Furthermore, after the roller returns, the stencil is dismounted from the fixing frame directly with convenience and replaced.

The above-mentioned motor unit 13 of the fixing portion 11 is provided with a first motor unit 115 for driving the roller to turn. The first motor unit 115 is formed as an electric motor, automatizing the fixing frame 1.

The above-mentioned motor unit 13 of the fixing portion 11 is provided with a second motor unit 116, which is formed as a telescopic cylinder (pneumatic cylinder or oil cylinder), automatizing the fixing frame 1. The second motor unit 116 drives the base 111 to translationally move outwardly and applies the pulling forces to the stencil. The magnitude of the pulling forces is adjusted by translationally moving the base 111 outwardly, i.e., the more the base 111 translationally moves, the greater the pulling force the base provides. Furthermore, after the base 111 returns, the stencil is dismounted from the fixing frame directly with convenience and replaced.

Figure 4:
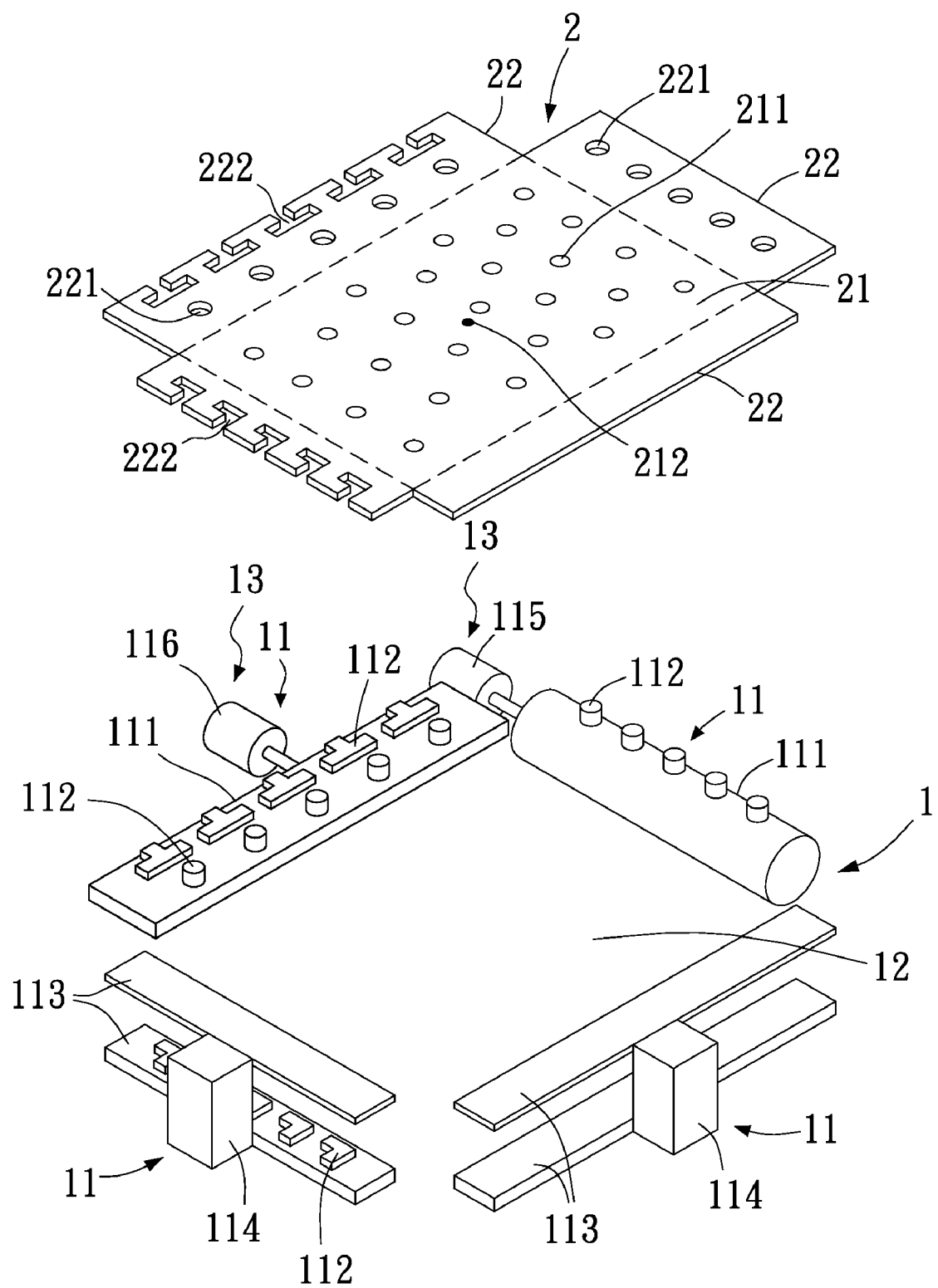
FIG. 4 is a disassembled diagram of the fixing frame and a stencil according to one embodiment of the present invention.
Figure 5:
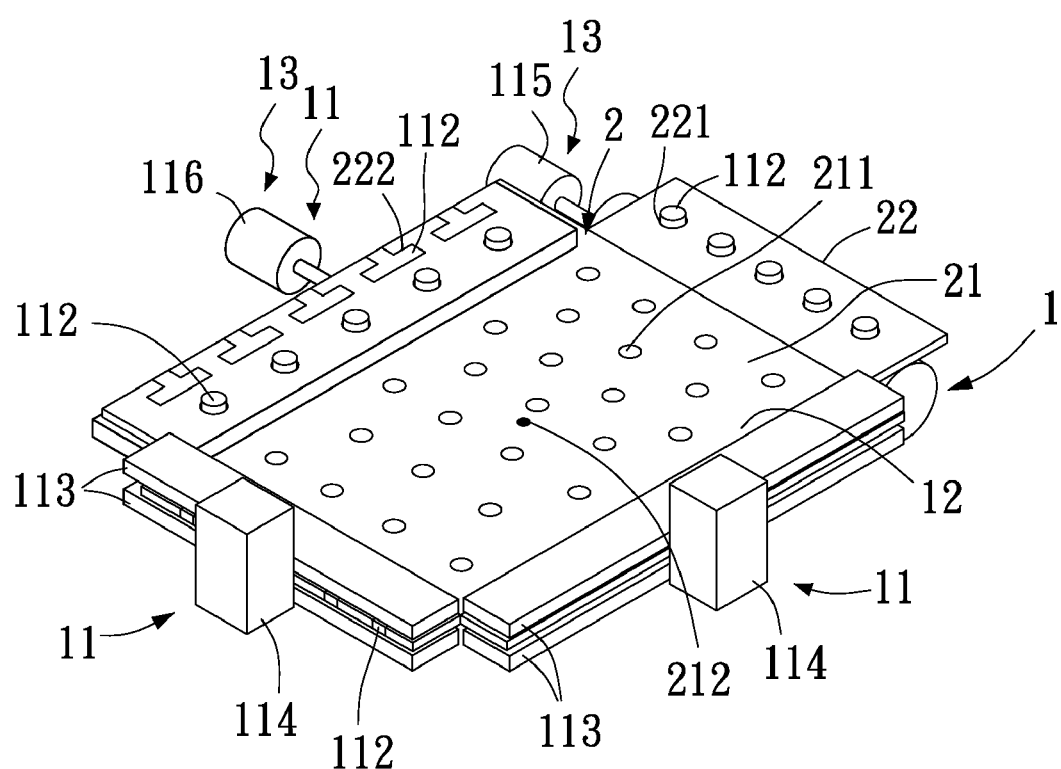
FIG. 5 is an assembled diagram of the fixing frame and the stencil according to one embodiment of the present invention.
Figure 6:
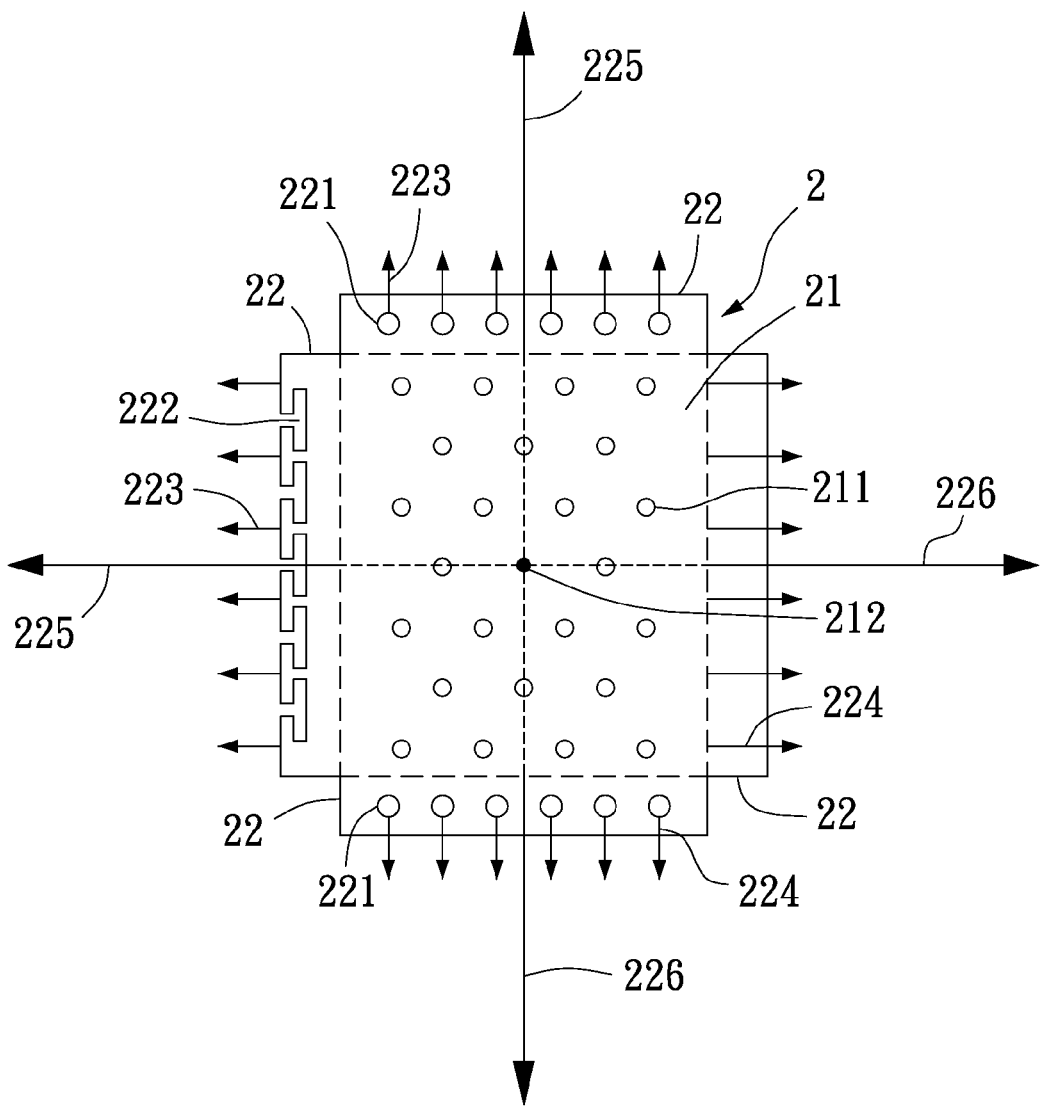
FIG. 6 is a diagram of pulling forces born by the stencil according to one embodiment of the present invention.

FIGS. 4 to 6 are shown a disassembled diagram and an assembled diagram of the fixing frame and the stencil, as well as a diagram of pulling forces born by the stencil, respectively, according to one embodiment of the present invention. As illustrated in these figures, a second mode of the present invention is directed to an assembled fixing device for printing solder paste on a printed circuit board, comprising the fixing frame 1 and a stencil 2. In this connection, the fixing frame 1 is provided with a plurality of fixing portions 11 and at lest one motor unit 13. In this embodiment, there are shown four fixing portions 11 and two motor units 13. These fixing portions 11 are movably combined with each other to define the hollowed-out planar region 12, which is surrounded by the fixing portions 11. In this embodiment, the four fixing portions 11 are shown to be connected to each other to define a rectangle (These fixing portions 11 are assembled to each other by providing them on a hollowed-out frame body (not shown) together.), and the hollowed-out planar region 12 is also surrounded as a rectangle. The motor units 13, provided on the fixing portions 11, are used for providing a plurality of pulling forces 223, which are equal in magnitude, by means of mechanical transmission. The stencil 2 is provided with a solder paste printing region 21, and a plurality of fixing regions 22 defined by outward extensions of edges of the solder paste printing region 21. In this embodiment, the solder paste printing region 21 is presented as a rectangle. The fixing regions 22 are defined by outward extensions of four edges of the solder paste printing region 21. The solder paste printing region 21 is provided with first vias 211 which, passing through the stencil, is used for providing solder paste and adhering it onto the printed circuit board (not shown). In this embodiment, the solder paste printing region 21 is provided with a plurality of vias 211, used for holding a part of solder paste therein and further, adhering it onto the printed circuit board, after the solder paste is scraped across the solder paste printing region 21. The fixing regions 22 are movably fixed to the fixing portion 11 together to bear the pulling forces 223. The solder paste printing region 21 is located in the hollowed-out planar region 12. The pulling forces 223 are coplanar with the solder paste printing region 21, and the pulling forces 223 are collectively expressed as a total pulling force 225 on the fixing region 22 As illustrated in these figures, the fixing regions 22 located at four edges of the solder paste printing region 21 is used to be movably snapped or movably clamped by the fixing frame 1. The stencil 2 is assembled to the fixing frame 1 or dismounted therefrom easily and quickly by means of the fixing regions 22, as well as stored independently so as to save storage space, and replaced alone when it is replaced so as to reduce cost. Each fixing region 22, in addition, is designed for movably snapping or movably clamping as required, and for bearing the pulling forces 223 or not for bearing a plurality of pulling forces. For two fixing regions 22 corresponding to each other, either of them is designed for movably snapping or movably clamping, respectively, as well as either both of them are designed for bearing the plurality of pulling forces 223, or one fixing region 22 is allowed for bearing the plurality of pulling forces 223, while the other fixing region 22 is not allowed for bearing a plurality of pulling forces. In fact, when one fixing region 22 is allowed for bearing the plurality of pulling forces 223, while the other fixing region 22 is not allowed for bearing a plurality of pulling forces, reaction forces 224 of the pulling forces 223 are also generated actually in the other fixing region 22. That is to say, even if a plurality of pulling forces are not born, the reaction forces of the pulling forces 223 (The pulling forces 224 in the opposite direction with respect to the pulling forces 223 are combined as a total pulling force 226.) are still born by the other fixing region 22 necessarily. Furthermore, when the plurality of pulling forces 223, equal in magnitude and coplanar with the solder paste printing region 21, are born by the fixing regions 22, an uniform distribution of tension within the solder paste printing region 21 is ensured, and the concentration of stress on specific locations of the fixing regions 22 is also avoided when the increased number of pulling forces 223 is obtained. Finally, the total pulling forces 225, 226 pass through a centroid 212 of the solder paste printing region 21, and the sum of the total pulling forces 225, 226 is zero, so as to flatten the solder paste printing region 21 of the stencil 2, in the case of non-deformation of the first vias 211. The deformation of the first vias 211 indicates that the stencil 2 is damaged without usefulness. Therefore, it is also necessary to control the magnitude of the pulling forces 223 when the solder paste printing region 21 of the stencil 2 is flattened, so as to avoid the damage to the stencil 2 due to the pulling forces 223. Moreover, the generation of torque within the solder paste printing region 21 and the generation of displacement of the stencil 2 are avoided, when the total pulling forces 225, 226 pass through the centroid 212 of the solder paste printing region 21 and the sum of the total pulling forces 225, 226 is zero. To sum up, the assembled fixing device for printing solder paste on a printed circuit board of the present invention enables the solder paste printing region of the stencil to lie on the printed circuit board, and enables the solder paste to be applied to the printed circuit board accurately.

Each of the above-mentioned fixing regions 22 is presented as a strip, and provided along the edge of the solder paste printing region 21. The fixing region 22 formed as a strip can be easily manufactured, as well as easily designed as a movably clamping structure, and easily designed thereon with a movably snapping structure.

The above-mentioned motion is either movable snapping or movable clamping.

When the above-mentioned fixing region 22 is movably snapped onto the fixing portion 11, the fixing portion 11 is provided with the base 111 and the plurality of snapping posts 112. The fixing region 22 is provided with a plurality of second vias 221, a plurality of snapping slots 222, or a plurality of second vias 221 together with a plurality of snapping slots 222, so as to accommodate the snapping posts 112 provided on the surface of the base 111. The base 111 is driven by the motor unit 13, in such a way that the second vias 221, the snapping slots 222, or the plurality of second vias 221 together with the plurality of snapping slots 222 are pulled to move outwardly, while the pulling forces are applied to the stencil 2 to prevent it from coming off the fixing frame 1 easily, by the snapping posts 112. The base 111 is driven by the motor unit 13 manually or mechanically. When the fixing region 22 is movably clamped by the fixing portion 11, the fixing portion 11 is provided with two clamping plates 113, and a driving means 114 provided between the two clamping plates 113 so as to clampingly fix the fixing region 22. The driving means 114 is formed as C-clip, for instance, to be driven manually or mechanically. In addition, the generation of slip of the fixing region 22 can be avoided truly if the clamping plates 113 are operated together with the snapping posts 112.

The above-mentioned base 111 is a roller for driving the snapping posts 112 to move outwardly, while applying the pulling forces to the stencil 2 by the rotation of the roller. The magnitude of the pulling forces is adjusted by turning the roller, i.e., the more the roller turns, the greater the pulling force the roller provides. Furthermore, after the roller returns, the stencil is dismounted from the fixing frame directly with convenience and replaced.

The above-mentioned motor unit 13 of the fixing portion 11 is provided with a first motor unit 115 for driving the roller to turn. The first motor unit 115 is formed as an electric motor, automatizing the fixing frame 1.

The above-mentioned motor unit 13 of the fixing portion 11 is provided with a second motor unit 116, which is formed as a telescopic cylinder (pneumatic cylinder or oil cylinder), automatizing the fixing frame 1. The second motor unit 116 drives the base 111 to move outwardly and applies the pulling forces to the stencil 2. The magnitude of the pulling forces is adjusted by moving the base 111 outwardly, i.e., the more the base 111 translationally moves, the greater the pulling force the base provides. Furthermore, after the base 111 returns, the stencil 2 is dismounted from the fixing frame 1 directly with convenience and replaced.

The above-mentioned snapping slots 222 are L-shaped or T-shaped, or are of other shapes, in order to be designed as a snapping structure. The snapping posts 112 are L-shaped, T-shaped or cylindrical, so as to correspond in shape to the snapping slots 222.

The above-mentioned stencil 2 is made of metallic material, such as steel, for example, thus having the advantage of coming off the solder paste more easily, in such a way that the solder paste is adhered onto the printed circuit board truly when the stencil 2 is separated from the printed circuit board.

Figure 7:
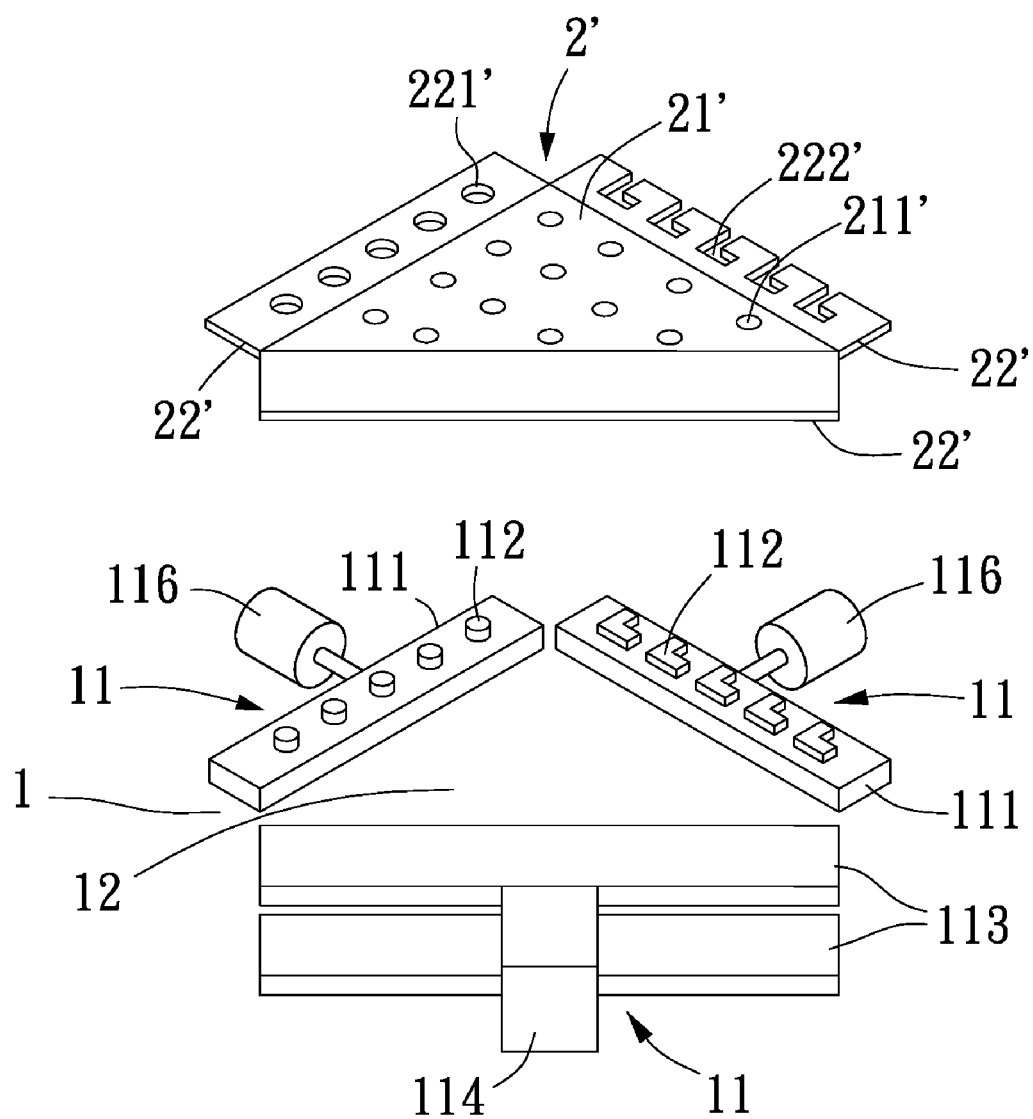
FIG. 7 is a disassembled diagram of a fixing frame and a stencil according to another embodiment of the present invention.
Figure 8:
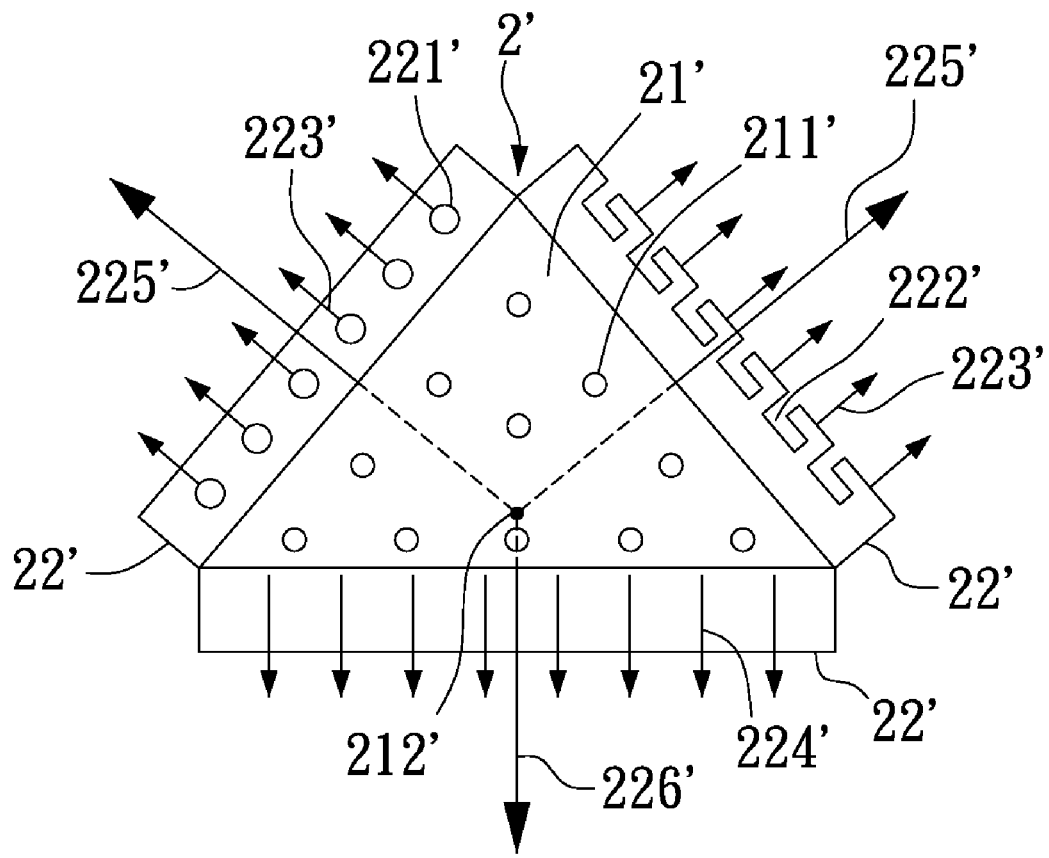
FIG. 8 is a diagram of pulling forces born by the stencil according to another embodiment of the present invention.

FIGS. 7 and 8 are a disassembled diagram of a fixing frame and a stencil, as well as a diagram of pulling forces born by the stencil, respectively, according to another embodiment of the present invention. As illustrated in these figures, a solder paste printing region 21' is designed as a triangle or other shapes, except for the rectangle of the above-mentioned solder paste printing region 21, as required, only if the condition of pulling forces 223' meets that stated above. As illustrated in these figures, the fixing regions 22' at two legs are designed for being movably clamped by two fixing portions 11 (by means of the base 111 and the snapping posts 112 of each fixing portion) of the fixing frame 1, respectively (by means of second vias 221' and snapping slots 222'), and allowed to bear the plurality of pulling forces 223', which are equal in direction, equal in magnitude and coplanar with the solder paste printing region 21'. The fixing region 22' at the bottom is then designed for being movably clamped in the fixing region 11 of the fixing frame 1 (by means of the two clamping plates 113 and the driving means 114), and allowed to generate reaction forces of the pulling forces 223' (pulling forces 224', in one direction opposite to that of the pulling forces 223' and combined as a total pulling force 226'). All of two total pulling forces 225' on the fixing portions 22' at two legs and the total pulling force 226' (the reaction force) on the bottom fixing region 22' pass through a centroid 212' of the solder paste printing region 21', and the sum of the total pulling forces 225', 226' is zero, in the case of non-deformation of the first vias 211'. Thereby, the solder paste printing region 21' presented as a triangle is thus flattened. In addition, a plurality of pulling forces is also born by the bottom fixing region 22' instead, and the solder paste printing region 21' formed as a triangle is also thus flattened, only if the condition of pulling forces meets that stated above.

Figure 9:
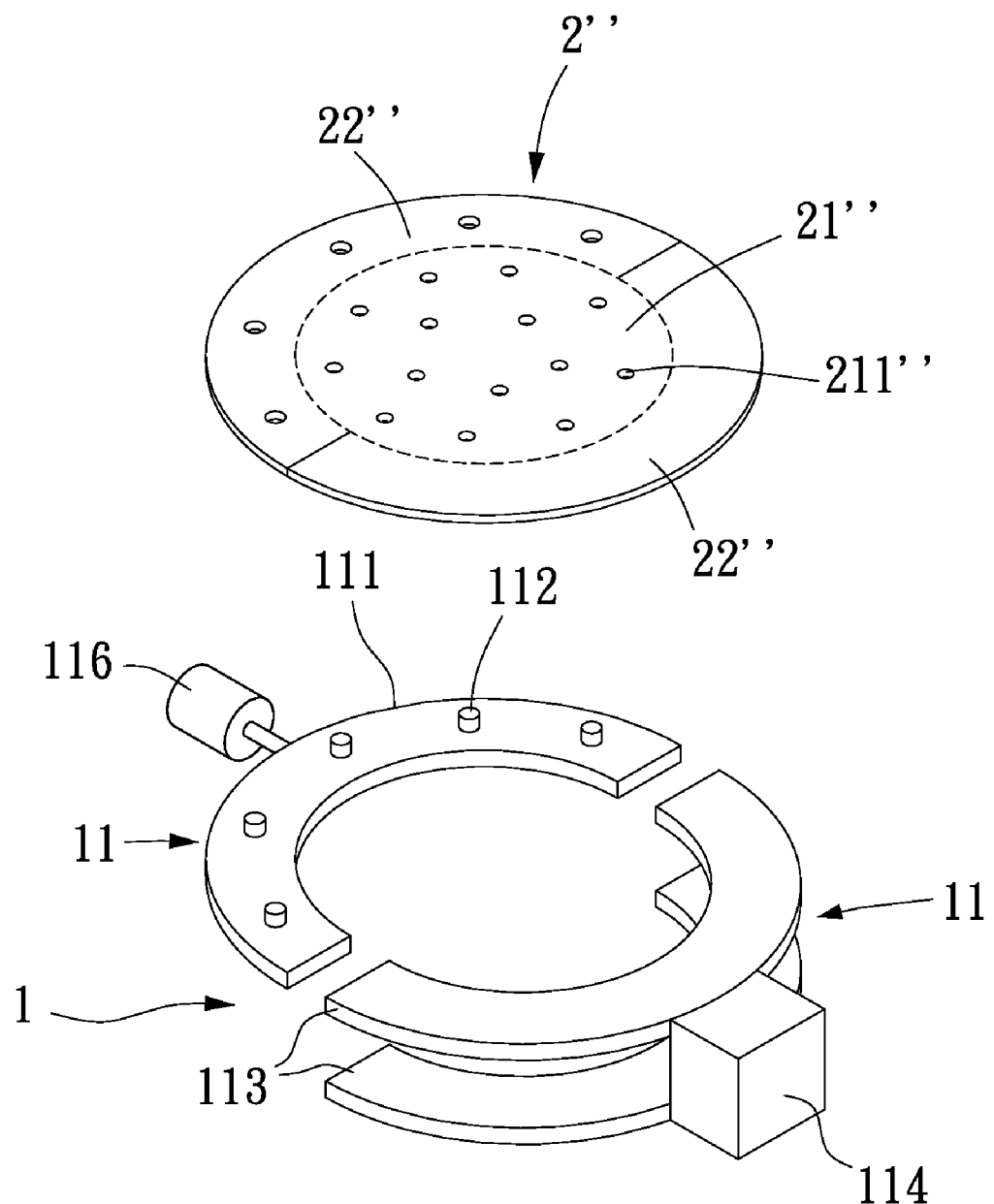
FIG. 9 is a disassembled diagram of a fixing frame and a stencil according to a further embodiment of the present invention.
Figure 10:
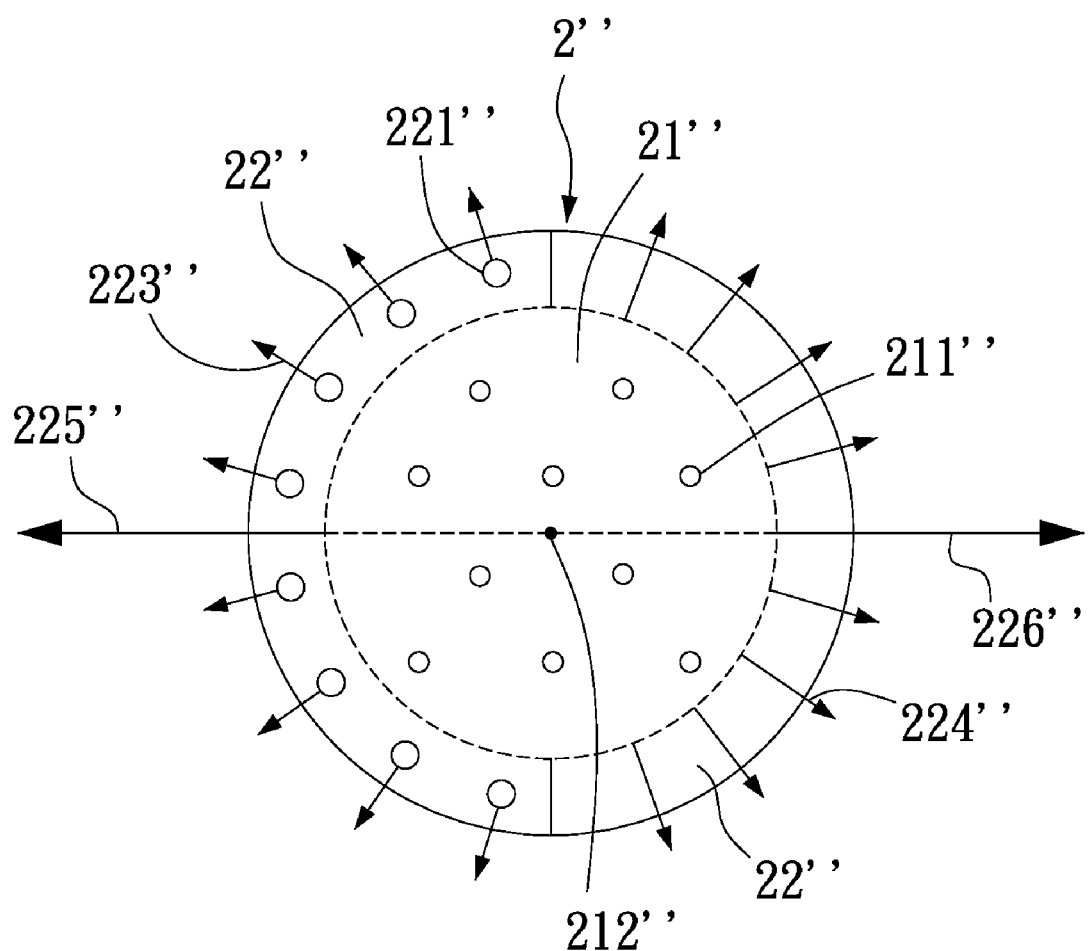
FIG. 10 is a diagram of pulling forces born by the stencil according to a further embodiment of the present invention.

FIGS. 9 and 10 are a disassembled diagram of a fixing frame and a stencil, as well as a diagram of pulling forces born by the stencil, respectively, according to a further embodiment of the present invention. As illustrated in these figures, a solder paste printing region 21" is round in appearance or takes other shapes, except for the rectangle of the above-mentioned solder paste printing region 21, as required, only if the condition of pulling forces 223" meets that stated above. As illustrated in these figures, a fixing region 22" on the left side is designed for being movably clamped by the fixing portions 11 (by means of the base 111 and the snapping posts 112 of each fixing portion) of the fixing frame 1 (by means of second vias 221"), and allowed to bear the plurality of pulling forces 223", which are directed radially, equal in magnitude and coplanar with the solder paste printing region 21". The fixing region 22" at right side is then designed for being movably clamped by the fixing region 11 of the fixing frame 1 (by means of the two clamping plates 113 and the driving means 114), and allowed to generate reaction forces of the pulling forces 223" (pulling forces 224", in one direction opposite to that of the pulling forces 223" and combined as a total pulling force 226"). Both of two total pulling forces 225" on the left fixing portions 22" and the total pulling force 226" (the reaction force) on the right fixing region 22" pass through a centroid 212" of the solder paste printing region 21", and the sum of the total pulling forces 225", 226" is zero, in the case of non-deformation of the first vias 211". Thereby, the solder paste printing region 21" presented as a circle is thus flattened. In addition, a plurality of pulling forces is also born by the right fixing region 22" instead, and the solder paste printing region 21" formed as a circle is also thus flattened, only if the condition of pulling forces meets that stated above.

Figure 11:
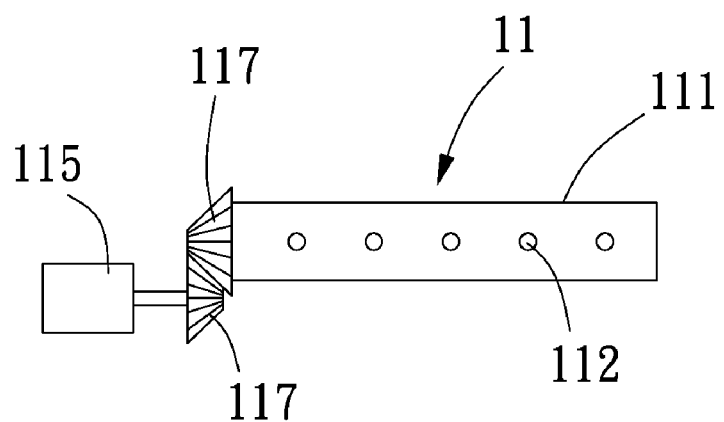
FIG. 11 is a perspective diagram of a fixing frame according to another embodiment of the present invention.

FIG. 11 is a perspective diagram of a fixing portion according to another embodiment of the present invention. As illustrated in this figure, the base 111, served as the roller, is driven by the first motor unit 115, used as an electric motor, via two bevel gears 117 other than in a direct way. The two bevel gears 117 are provided on the base 111 and the first motor unit 115, respectively, in such a way that more types of design are implemented in the first motor unit 115. For instance, torque provided by one motor unit is provided by the first motor unit 115 with lower power together with the gear ratio between two bevel gears 117.

Figure 12:
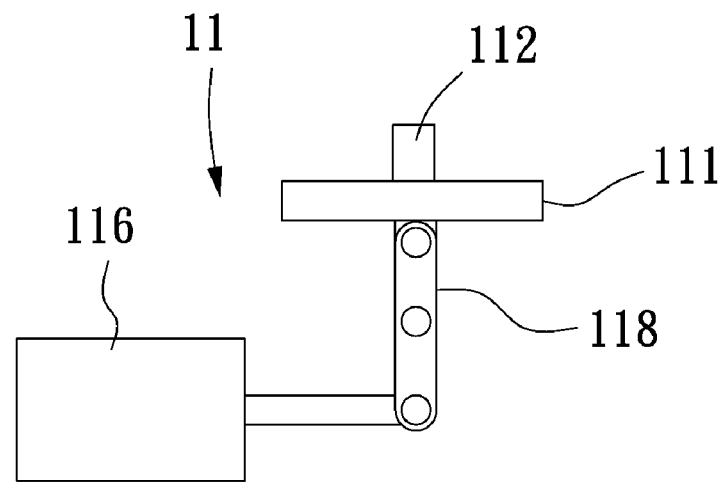
FIG. 12 is a perspective diagram of a fixing frame according to a further embodiment of the present invention.

FIG. 12 is a perspective diagram of another fixing portion according to a further embodiment of the present invention. As illustrated in this figure, the base 111 is driven by the second motor unit 116, used as a telescopic cylinder, via a link 118 other than in a direct way. Two ends of the link 118 are pivotally connected to the base 111 and the second motor unit 116, respectively, in such a way that more types of design are implemented in the second motor unit 116. For instance, torque provided by one motor unit is provided by the second motor unit 116 with lower power together with the length ration between force arms of the link 118.

The present invention is disclosed by embodiments in foregoing description. However, it should be understood by those skilled in the art that the embodiments are merely used for describing the present invention and not considered as restrictive. It should be noted, that all equivalent variations and substitutions may be included within the scope of the present invention. Therefore, the present invention to be protected should be defined by appended claims.

What is claimed is:

1. A fixing frame for printing solder paste on a printed circuit board, comprising:
   a plurality of fixing portions movably combined with each other to define a hollowed-out planar region; and
   at least one motor unit disposed on the fixing portion for providing a plurality of pulling forces coplanar with the hollowed-out planar region by means of mechanical transmission;
   wherein a motion of the plurality of fixing portions is movable snapping;
   wherein the fixing portion is provided with a base and a plurality of snapping posts, the snapping posts being provided on a surface of the base and having a plurality of shapes, the base being driven by the at least one motor unit to move the plurality of snapping posts outwardly and provide the plurality of pulling forces when the plurality of fixing portion is used for movably snapping.

2. The fixing frame according to claim 1, wherein the fixing portion is used for movably snapping a strip-like region.

3. The fixing frame according to claim 1, wherein the motion of the plurality of fixing portions is movable clamping.

4. The fixing frame according to claim 1, wherein the at least one motor unit is provided with a second motor unit for driving the base to move translationally.

5. The fixing frame according to claim 3, wherein the fixing portion is provided with two clamping plates and a driving means, the driving means being provided between the two clamping plates so as to drive the two clamping plates to approach each other when it is used for movably clamping.

6. An assembled fixing device for printing solder paste on a printed circuit board, comprising:
   a fixing frame having a plurality of fixing portions and at least one motor unit, the fixing portions being movably combined with each other to define a hollowed-out planar region, the at least one motor unit, provided on the fixing portion, being used for providing a plurality of pulling forces by means of mechanical transmission; and
   a stencil having a solder paste printing region and a plurality of fixing regions, the plurality of fixing regions being defined by outward extensions of edges of the solder paste printing region, the solder paste printing region being provided with first vias passing through the stencil and located in the hollowed-out planar region, the plurality of fixing regions being movably fixed to the fixing portion together to bear the plurality of pulling forces, the plurality of pulling forces being coplanar with the solder paste printing region so as to flatten the solder paste printing region of the stencil;
   wherein a motion of the plurality of fixing portions is movable snapping;
   wherein each of the plurality of fixing portions are provided with a base and a plurality of snapping posts, the plurality of snapping plurality of shapes, the fixing region being provided with a plurality of second vias and a plurality of snapping notches, the plurality of second vias accommodating the plurality of snapping posts provided on a surface of the base when the fixing region is used for movably snapping the fixing portion, the base being then driven by the at least one motor unit in such a way that the second vias are pulled to move outwardly by the plurality of snapping posts.

7. The assembled fixing device according to claim 6, wherein the motion of the plurality of fixing portions is movable clamping.

8. The assembled fixing device according to claim 6, wherein the motor unit is provided with a second motor unit for driving the base to move translationally.

9. The assembled fixing device according to claim 7, wherein, the fixing portion is provided with two clamping plates, and a driving means provided between the two clamping plates, so as to drive the two clamping plates to approach each other for clamping the fixing region when the fixing region is used for movably clamping the fixing portion.

10. A fixing frame for printing solder paste on a printed circuit board, comprising:
   a plurality of fixing portions movably combined with each other to define a hollowed-out planar region; and
   at least one motor unit disposed on the plurality of fixing portions for providing a plurality of pulling forces coplanar with the hollowed-out planar region by means of mechanical transmission, wherein a motion of the plurality of fixing portions is movable clamping, the plurality of fixing portions are each provided with two clamping plates and a driving means, the driving means being provided between the two clamping plates so as to drive the two clamping plates to approach each other when it is used for movably clamping.

11. The fixing frame according to claim 10, wherein the plurality of fixing portions are used for movably clamping a strip-like region.

12. An assembled fixing device for printing solder paste on a printed circuit board, comprising:
   a fixing frame having a plurality of fixing portions and at least one motor unit, the plurality of fixing portions being movably combined with each other to define a hollowed-out planar region, the at least one motor unit, provided on the plurality of fixing portions, being used for providing a plurality of pulling forces by means of mechanical transmission; and
   a stencil having a solder paste printing region and a plurality of fixing regions, the plurality of fixing regions being defined by a plurality of outward extensions of a plurality of edges of the solder paste printing region, the solder paste printing region being provided with a first vias passing through the stencil and located in the hollowed-out planar region, the plurality of fixing regions being movably fixed to the plurality of fixing portions together to bear the plurality of pulling forces, the plurality of pulling forces being coplanar with the solder paste printing region so as to flatten the solder paste printing region of the stencil, wherein a motion of the plurality of fixing portions is movable clamping, the plurality of fixing portions are each provided with two clamping plates, and a driving means provided between the two clamping plates, so as to drive the two clamping plates to approach each other for clamping the plurality of fixing regions when the plurality of fixing regions are used for movably clamping the plurality of fixing portions.

* * * * *